US006963099B2

(12) United States Patent
Fukuzumi (10) Patent No.: US 6,963,099 B2
(45) Date of Patent: Nov. 8, 2005

(54) MAGNETIC MEMORY DEVICE AND METHOD OF MANUFACTURING THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/915,511

(22) Filed: Aug. 10, 2004

(65) Prior Publication Data

US 2005/0007819 A1 Jan. 13, 2005

Related U.S. Application Data (63) Continuation of application No. 10/315,880, filed on Dec. 10, 2002, now Pat. No. 6,794,696.

(30) Foreign Application Priority Data

Sep. 24, 2002 (JP) .............................. 2002-278071

(51) Int. Cl.[7] .............................................. H01L 29/76
(52) U.S. Cl. .............................. 257/295; 257/E21.665; 257/E27.005; 257/315; 257/421; 365/158; 365/173
(58) Field of Search ................. 257/E21.665, E27.005, 257/315, 421; 365/158, 173

(56) References Cited

U.S. PATENT DOCUMENTS 6,211,090 B1 4/2001 Durlam et al.

6,556,473 B2 * 4/2003 Saito et al. .................. 365/158

OTHER PUBLICATIONS

Scheuerlein, et al., "A 10ns Read and Write Non-Volatile Memory Array Using A Magnetic Tunnel Junction and FET Switch in Each Cell", ISSCC 2000, Digest Paper TA 7.2, pp. 128-129.

Sato, et al., "Spin-Valve-Like Properties of Ferromagnetic Tunnel Junctions", Jpn. J. Appl. Phys. vol. 36, (1997) pp. L 200-L 201.

Inomata, et al., "Spin-Dependent Tunneling Between a Soft Ferromagnetic Layer and Hard Magnetic Nanosize Particles", Jpn. J. Appl. Phys. vol. 36, (1997) pp. L 1380-L 1383.

\* cited by examiner

*Primary Examiner*—David Nelms
*Assistant Examiner*—Mai-Huong Tran
(74) *Attorney, Agent, or Firm*—Hogan & Hartson, LLP (57) ABSTRACT

A magnetic memory device includes a magnetoresistance configured to store information. A first wiring is provided along a first direction. The first wiring has a function of applying a magnetic field to the magnetoresistance element. The first wiring has a first surface and a second surface. The second surface faces the magnetoresistance element and the first surface is opposite to it. The second surface is smaller in width than the first surface.

15 Claims, 11 Drawing Sheets

MAGNETIC MEMORY DEVICE AND METHOD OF MANUFACTURING THE SAME

This is a continuation of application Ser. No. 10/315,880 filed Dec. 10, 2002 now U.S. Pat. No. 6,794,696, which application is hereby incorporated by reference in its entirety.

CROSS-REFERENCE TO RELATED APPLICATIONS

This application is based upon and claims the benefit of priority from the prior Japanese Patent Application No. 2002-278071, filed on Sep. 24, 2002, the entire contents of which are incorporated herein by reference.

BACKGROUND OF THE INVENTION

1. Field of the Invention

The present invention relates to a magnetic memory device and a method of manufacture of the same. More specifically, the present invention relates to the structure of wirings of a magnetic memory device.

2. Description of the Related Art

Magnetic memory devices that utilize magnetic properties are known. The magnetic memory devices store information utilizing the tunneling magnetoresistance (referred hereinafter to as TMR) effect.

One example of such magnetic memory devices is a so-called magnetic random access memory (MRAM). The MRAM, which is a generic name for solid memories that utilize a direction of a magnetization of a ferromagnetic material as an information recording carrier, can rewrite, hold and read recorded information whenever necessary.

Figure 22A:
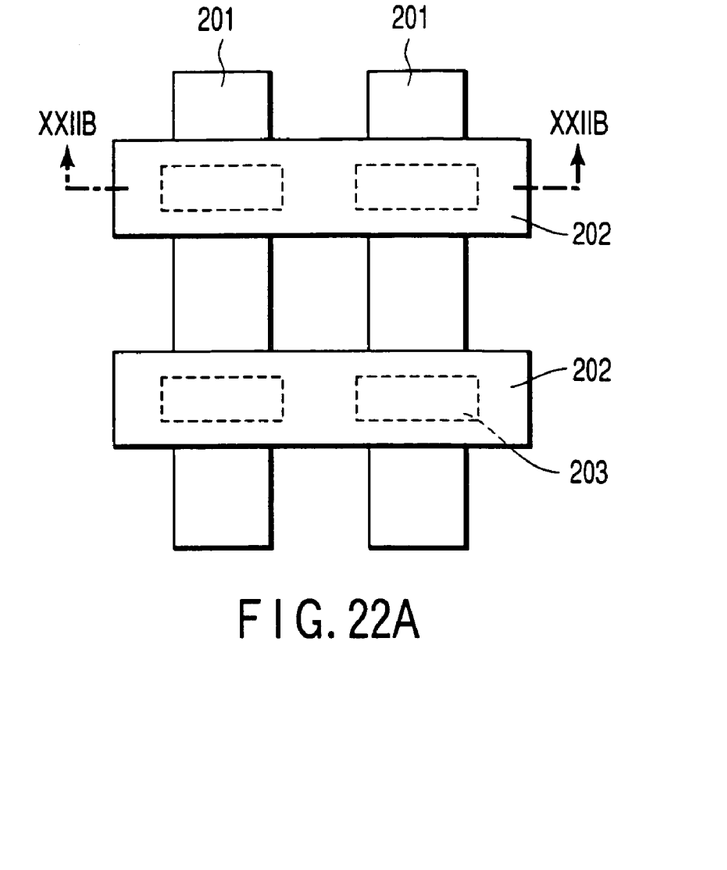
FIGS. 22A and 22B are plan and sectional views, respectively, of a typical magnetic memory device.
Figure 22B:
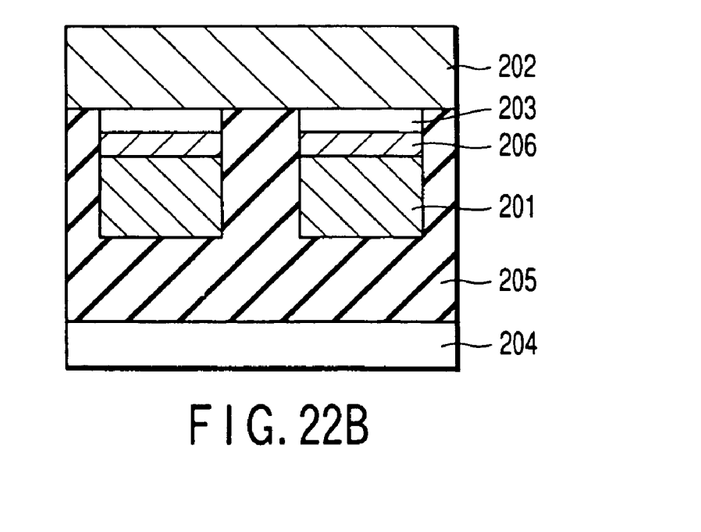

FIG. 22A is a plan view schematically illustrating the structure of part of a typical magnetic memory device. FIG. 22B is a sectional view taken along line XXIIB—XXIIB of FIG. 22A. As shown in these figures, first and second write wirings 201 and 202 are arranged in a matrix form. A memory cell 203 is placed between the first and second write wirings 201 and 202 at each of intersections thereof.

As each of the memory cells 203 use is made of a MTJ element based on a magnetic tunnel junction (MTJ) (see, for example, ISSCC 2000 Digest Paper TA7.2). The MTJ element is comprised of a fixed layer, a tunnel barrier layer, and a recording layer, which are stacked in sequence.

In writing information into a selected memory cell, currents are caused to flow through the first and second write wirings associated with the selected cell. As a result, a magnetic field is produced at the intersection between the first and second write wirings, reversing the magnetization direction of the recording layer of the selected cell. Binary information is recorded depending on whether the magnetization direction of the recording layer is parallel or antiparallel with respect to that of the fixed layers. The intensity of a magnetic field (switching field) required to reverse the magnetization direction will be of the order of tens of Oe in a 0.1-$\mu$m rule by way of example.

The reading of recorded information is achieved by utilizing the magnetoresistance. The magnetoresistance is a phenomenon by which the electrical resistance of a memory cell changes according to the relative angle between the magnetization direction of the ferromagnetic body of the cell and current. A change in the resistance is read by causing current to flow in the memory cell.

As described above, in writing information into a selected memory cell 203 a current is caused to flow in each of the first and second write wirings 201 and 202. Memory cells in the neighborhood of the selected memory cell (hereinafter referred to as semi-selected memory cells) are affected by magnetic fields resulting from the currents in the wirings. As a consequence, the semi-selected memory cells may be written with erroneous information. This problem will become more serious as the integrated density of magnetic memory devices increases and hence the spacing between each memory cell decreases.

In order to prevent the semi-selected memory cells from being written with erroneous information, it may be effective to adjust the current value in each of the write wirings 201 and 202 associated with a selected memory cell. In order to generate the aforementioned switching field, however, it is required to cause a current of a predetermined magnitude in each of the write wirings. For this reason, a problem arises in that the tolerance for the current value at the time of writing is very small.

BRIEF SUMMARY OF THE INVENTION

According to a first aspect of the present invention, there is provided a magnetic memory device comprising: a magnetoresistance configured to store information; and a first wiring provided along a first direction, the first wiring applying a magnetic field to the magnetoresistance element and having a second surface which faces the magnetoresistance element and a first surface opposite to the second surface, the second surface being smaller in width than the first surface.

According to a second aspect of the present invention, there is provided a method of manufacturing a magnetic memory device comprising: forming a first wiring over a semiconductor substrate along a first direction, the first wiring having a first surface which faces the semiconductor substrate and second surface opposite to the first surface, the second surface being smaller in width than the first surface; and forming a magnetoresistance element which records information over the first wiring.

DETAILED DESCRIPTION OF THE INVENTION

Figure 1:
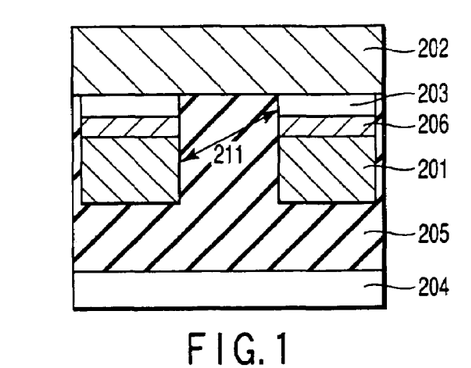
FIGS. 1, 2 and 3 are sectional views of magnetic memory devices for use in explanation of knowledge obtained during the process of making the present invention.
Figure 2:
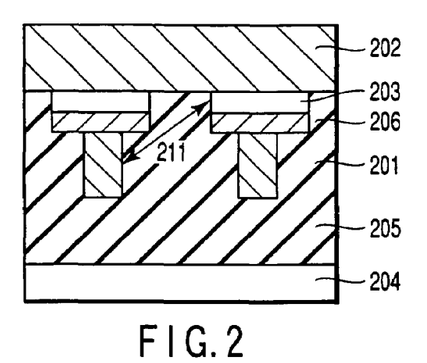
Figure 3:
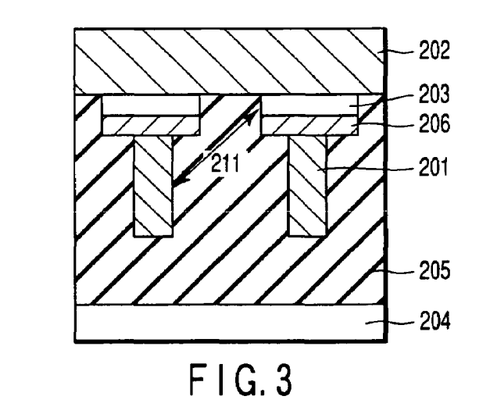

In the process of making the present invention, the inventors studied structures that are capable of preventing adjacent memory cells from being written with information by error in such a magnetic memory device as described with reference to FIGS. 22A and 22B. As a result, we have obtained some knowledge, which will be explained below with reference to FIGS. 1, 2 and 3. FIGS. 1, 2 and 3 are sectional views in the same direction as FIG. 22B.

In the first place, mere increasing of the spacing between adjacent cells is expected to avert the adverse effect on semi-selected memory cells. In FIG. 1, the spacing between the first write wirings 201 is made large in comparison with that in FIG. 22B, whereby the distance 211 between a semi-selected memory cell and the wiring in which a current flows is made long in comparison with that in the prior art. It will therefore become possible to prevent the semi-selected memory cells from being written with erroneous information.

However, increasing the spacing between the write wirings 201 results in an increase in the area of the memory cell array section and a consequent reduction in the integrated density of the magnetic memory device. This does not meet the miniaturization and high memory capacity requirements of magnetic memory devices. Increasing the spacing between the second write wirings 202 in place of or together with the first write wirings 201 will also result in the same problems.

Another approach to avert the adverse effect on semi-selected memory cells will be to decrease the cross-sectional area of the write wirings 201 by way of example. In FIG. 2, the cross-sectional area of the write wirings 201 is made smaller than in the prior art. This will make the distance 211 longer than in the prior art. It will therefore become possible to prevent the semi-selected memory cells from being written with erroneous information.

In general, from the point of view of the reliability of wirings, it will be necessary to consider the effect of electromigration. The electromigration causes wirings to deteriorate, decreasing the reliability of magnetic memory devices. The higher the current density in wirings becomes, the greater the effect of electromigration arises. It will therefore become possible to advert the effect of electromigration by decreasing the current density in wirings.

One way to decrease the current density will be to increase the cross-sectional area of wirings. The wirings thus should preferably have a cross-section of a certain size.

Another way to decrease the current density will be to reduce the magnitude of current in the wirings. In order to generate a switching magnetic field, however, it is required to set the current value in the write wirings larger than a predetermined value. For this reason, it is not allowed to decrease merely the current density in the wirings.

Thus, to obtain a current value (write current value) required not only to advert the effect of electromigration but also to generate a switching magnetic field, it is required to set the cross-sectional area of the write wirings to a predetermined value. Accordingly, it is not allowed to take such a structure as shown in FIG. 2 while satisfying the conditions for the cross-sectional area of the write wirings 201.

In addition, one way to increase the spacing between the write wirings and the semi-selected memory cells while setting the cross-sectional area of the write wirings to a predetermined value will be to make the vertical dimension of the cross-section of the write wirings large compared to their lateral dimension as shown in FIG. 3. By so doing, it becomes possible to increase the distance 211 while setting the cross-sectional area of the write wirings 201 at a predetermined value. It will therefore become possible to prevent the semi-selected memory cells from being written with erroneous information.

Such a magnetic memory device as shown in FIG. 3 suffers, however, from the following problems at manufacture time. First, after the formation of write wirings 201, a space between each write wiring is filled with an interlayer insulating film. However, since, in the structure of FIG. 3, the aspect ratio of the write wirings 201 is high, the interlayer insulating film may fail to fill up the gap. In that event, voids may be produced. The voids increase the roughness of the surface in which the memory cells 203 are formed, which may result in the degradation of characteristics of the memory cells.

Hereinafter, the embodiments of the present inventions implemented on the basis of such knowledge will be described with reference to the accompanying drawings. In the following description, constituent elements that have substantially the same function and configuration are denoted by like reference numerals and repeated descriptions thereof will be made only when necessary.

[First Embodiment]

Figure 4:
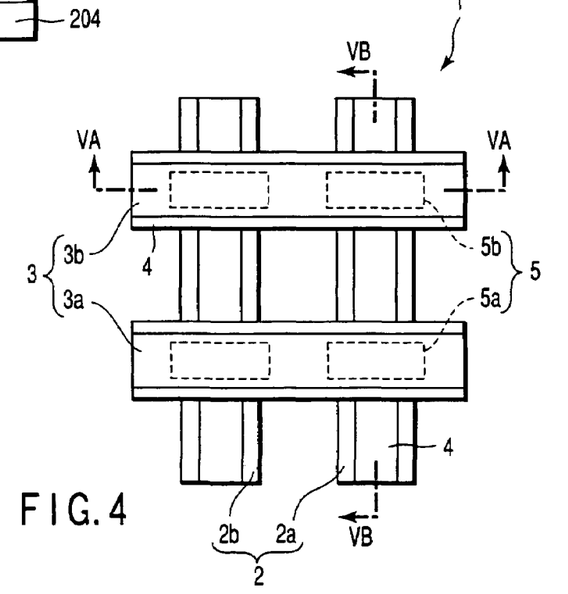
FIG. 4 is a schematic plan view of a magnetic memory device according to a first embodiment of the present invention.

FIG. 4 is a schematic plan view of a magnetic memory device according to a first embodiment of the present invention. As shown in FIG. 4, in the magnetic memory device of the first embodiment, which is generally indicated at 1, first write wirings 2a and 2b (collectively referred to as wirings 2) are formed along a first direction. The first write wirings 2 have a stacked structure of, say, TiN/Ti/Al (or AlCu)/TiN/Ti. The first write wirings 2 have a function of subjecting memory cells 5a and 5b (collectively referred to as memory cells 5) to a magnetic field and a function of data lines to read information from the memory cells 5.

Second write wirings 3a and 3b (collectively referred to as wirings 3) are formed over the first write wirings 2 (above the plane of the first write wirings 2 in the direction perpendicular to the drawing sheet). The second write wirings 3 are formed in a second direction different from the first direction. The second write wirings 3 have a function of subjecting the memory cells 5 to a magnetic field. The second write wirings 3 have a stacked structure of, say, Al/Nb. The first and second directions are typically defined to be substantially perpendicular to each other. The first and second write wirings 2 and 3 can be formed into a structure that has a barrier metal (or liner material) 4 as desired.

Each of the memory cells 5 is placed between the first and second write wirings 2 and 3 at a respective intersections formed with thereof. The memory cells 5 have their side along the direction of the second write wirings 3 made longer than that along the direction of the second write wirings 2. This allows the magnetization direction of the memory cells 5 to reverse easily along the second write wirings 3. The direction along the second write wirings 3 is referred to as the easy magnetization axis.

The memory cells 5 are each comprised of a MTJ element. The MTJ element has a stacked structure of a fixed layer(s) (pinned layer(s)), a recording layer (magnetic free layer) and a tunnel barrier layer(s). The fixed layer and the recording layer are each made of a ferromagnetic material and the barrier layer (nonmagnetic layer, insulating layer) is made of an insulating material.

Figure 5A:
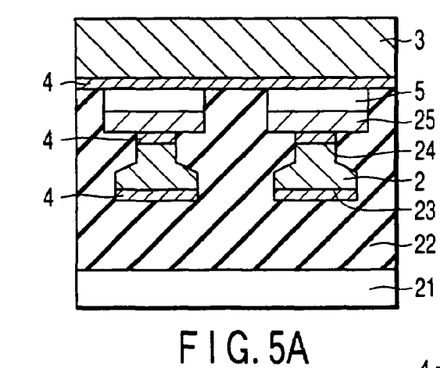
FIGS. 5A and 5B are schematic sectional views of the magnetic memory device of FIG. 4.
Figure 5B:
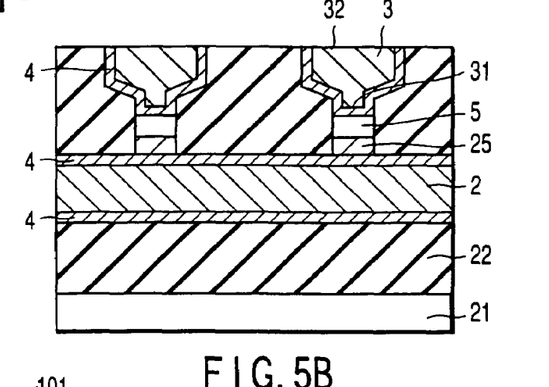

FIGS. 5A and 5B are schematic sectional views of the magnetic memory device shown in FIG. 4. More specifically, FIG. 5A is a sectional view taken along line VA—VA of FIG. 4 and FIG. 5B is a sectional view taken along line VB—VB of FIG. 4.

As shown in FIGS. 5A and 5B, an interlayer insulating film 22 is formed on a substrate 21. First write wirings 2 are placed within the interlayer insulating film 22. The first write wirings 2 have their width of its surface facing the memory cells 5 made smaller than that of the opposite surface. In other words, the first write wirings 2 each have a first surface 23 facing the substrate 21 and second surface 24 opposite to the first surface 23 (facing the memory cell 5). The width (the length in the second direction) of the second surface 24 is smaller than that of the first surface 23.

More specifically, the width of the first write wirings 2 is substantially fixed at the side of the first surface 23, and then starts to gradually decrease at its intermediate portion toward the second surface 24. The width of the second surface 24 can be set to, say, two-thirds or less of the width of the first surface 23. The reason will be described in detail later.

On a barrier metal 4 of the first write wiring 2 is provided a contact plug 25, which is made of a nonmagnetic material consisting of, say, W/TiN. The memory cell 5 is placed on the contact plug 25. The contact plug 25 and the memory cell 5 may have the same cross-sectional area.

On the memory cells 5 are provided second write wirings 3, each of which has the width of its surface facing the memory cell made smaller than that of the opposite surface 32. In other words, the second write wirings 3 each have a third surface 31 facing the memory cell 5 and fourth surface 32 opposite to the third surface 31. The width (the length in the first direction) of the third surface 31 is smaller than that of the fourth surface 32.

More specifically, the width of the second write wirings 3 is substantially fixed at the same width as the memory cells 5 at side of the third surface 31, and then starts to gradually increase at its intermediate portion toward the fourth surface 32. The width of the third surface 31 can be set to, say, two-thirds or less of the width of the fourth surface 32.

Next, the memory cells 5 will be described below. As the MJT structure of the MTJ element is known the so-called spin valve structure in which an antiferromagnetic body is placed adjacent to a ferromagnetic body in the fixed layer in order to fix the magnetization direction of the ferromagnetic material (see, for example, Jpn. J. Appl. Phys., 36, L200 (1997)). The spin valve structure can improve the sensitivity to magnetic fields.

Figure 6:
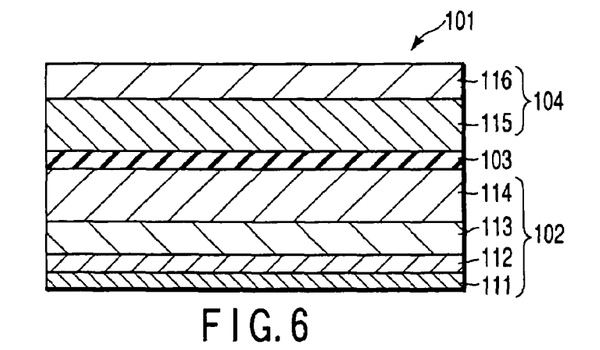
FIGS. 6 through 11 are sectional views illustrating exemplary memory cell structures.
Figure 7:
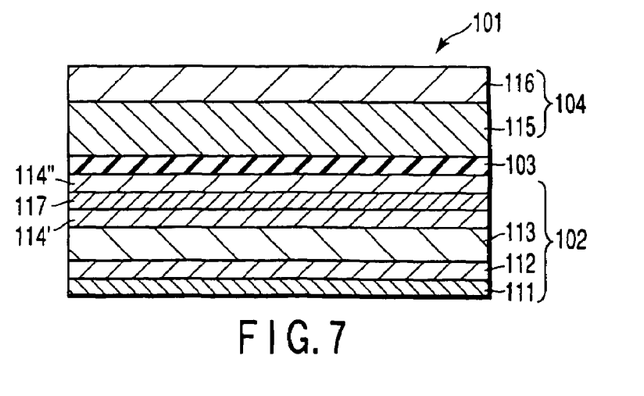
Figure 8:
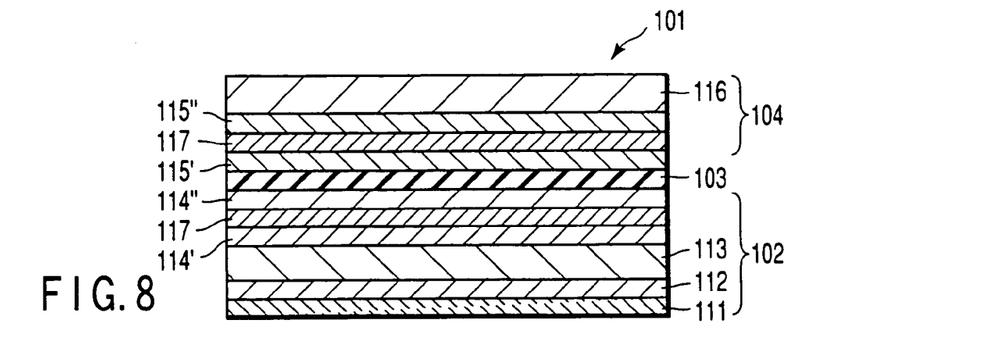

FIGS. 6, 7 and 8 illustrate, in sectional form, exemplary structures of a MTJ element 101 of the spin valve structure. The MTJ element 101 is structured to have a single tunnel barrier layer. That is, the MTJ element 101 has a fixed layer 102, a tunnel barrier layer 103, and a recording layer 104, which are stacked in the order mentioned. The structure of each of the fixed layer 102 and the recording layer 104 will be described in detail below.

The fixed layer 102 of the MTJ element shown in FIG. 6 has a template layer 111, an initial ferromagnetic layer 112, an antiferromagnetic layer 113, and a reference ferromagnetic layer 114, which are stacked in the order mentioned. The recording layer 104 has a free ferromagnetic layer 115 and a contact layer 116, which are stacked in the order mentioned.

The MTJ element 101 shown in FIG. 7 has a structure such that the fixed layer 102 is composed of more layers than that shown in FIG. 6. That is, the fixed layer 102 has the template layer 111, the initial ferromagnetic layer 112, the antiferromagnetic layer 113, a ferromagnetic layer 114', a nonmagnetic layer 117, and a ferromagnetic layer 114", which are stacked in the order mentioned. The recording layer 104 remains unchanged from that shown in FIG. 6.

The MTJ element 101 shown in FIG. 8 is different from the one shown in FIG. 7 in that the recording layer 104 is composed of more layers. That is, the fixed layer 102 remains unchanged from the one shown in FIG. 7 but the recording layer 104 has a ferromagnetic layer 115', a nonmagnetic layer 117, a ferromagnetic layer 115", and the contact layer 116. The structure of the MTJ element shown in FIG. 8 can suppress the generation of magnetic poles within the ferromagnetic layers in comparison with the one shown in FIG. 6, which is more suitable for miniaturizing of memory cells.

Each layer of the MTJ elements 101 shown in FIGS. 6, 7 and 8 can be formed from the following materials.

As materials for the layers of the fixed layer 102 and the recording layer 104 use can be made of, for example, Fe, Co, Ni, their alloys, magnetite having a large spin polarizability, and oxides, such as $CrO_2$, $RxMnO_{3-y}$ (R: rare earth elements, X: Ca, Ba, Sr), etc. In addition, Heusler alloys, such as NiMnSb and PtMnSb, etc., can also be used. These ferromagnetic materials are allowed to contain nonmagnetic elements, such as Ag, Cu, Au, Al, Mg, Si, Bi, Ta, B, C, O, Pd, Pt, Zr, Ir, W, Mo, Nb, etc., in some quantity unless they lose ferromagnetic properties.

Examples of materials for the antiferromagnetic layer 113 that forms a part of the fixed layer 102 include Fe—Mn, Pt—Mn, Pt—Cr—Mn, Ni—Mn, Ir—Mn, NiO, and $Fe_2O_3$.

As materials for the tunnel barrier layer 103 use can be made of dielectric materials, such as $Al_2O_3$, $SiO_2$, MgO, AlN, $Bi_2O_3$, $MgF_2$, $CaF_2$, $SrTiO_2$, $AlLaO_3$, etc. These materials are allowed to contain oxygen, nitrogen, or fluorine depletion.

The structures of the MTJ element 101 shown in FIGS. 6, 7 and 8 are applicable to other embodiments which will be described later.

The memory cells 5 may be formed into a so-called double tunnel barrier layer structure. The memory cells of the double tunnel barrier layer structure are each composed, of a first fixed layer 122, a first tunnel barrier layer 123, a recording layer 104, a second tunnel barrier layer 125, and a second fixed layer 126, which are stacked in the order mentioned. The double tunnel barrier layer structure can keep high the rate of change of magnetic resistance with respect to applied voltage to the memory cells. In addition, the withstanding voltage of the memory cells can also be increased. The first and second tunnel barrier layers 123 and 125 can be formed from the same material as the tunnel barrier layer 103.

Figure 9:
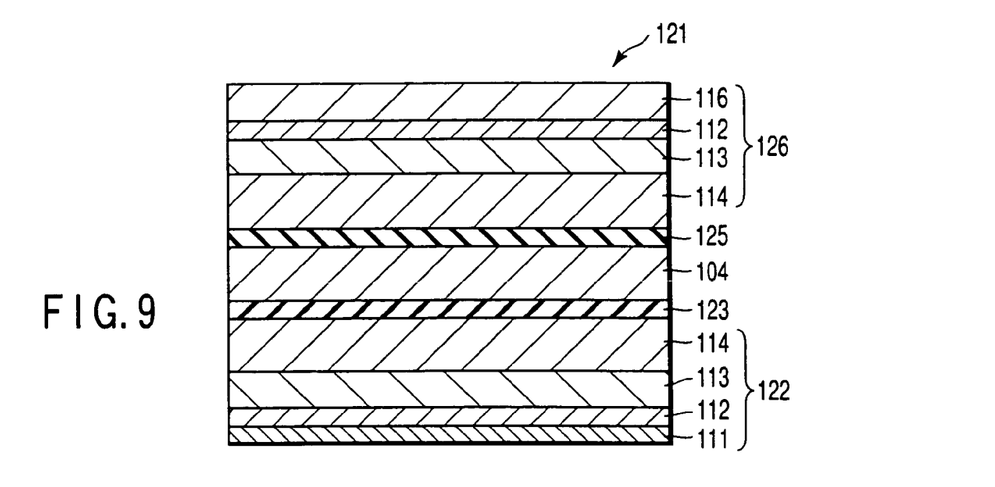
Figure 10:
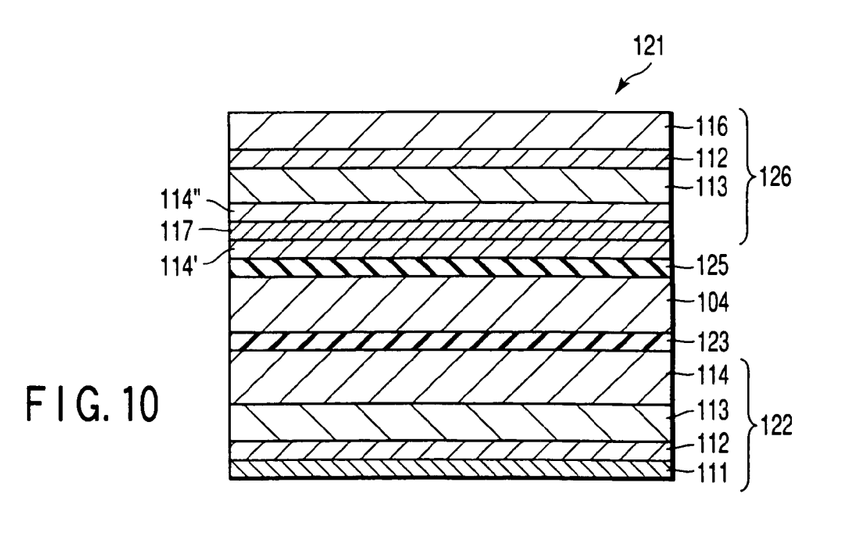
Figure 11:
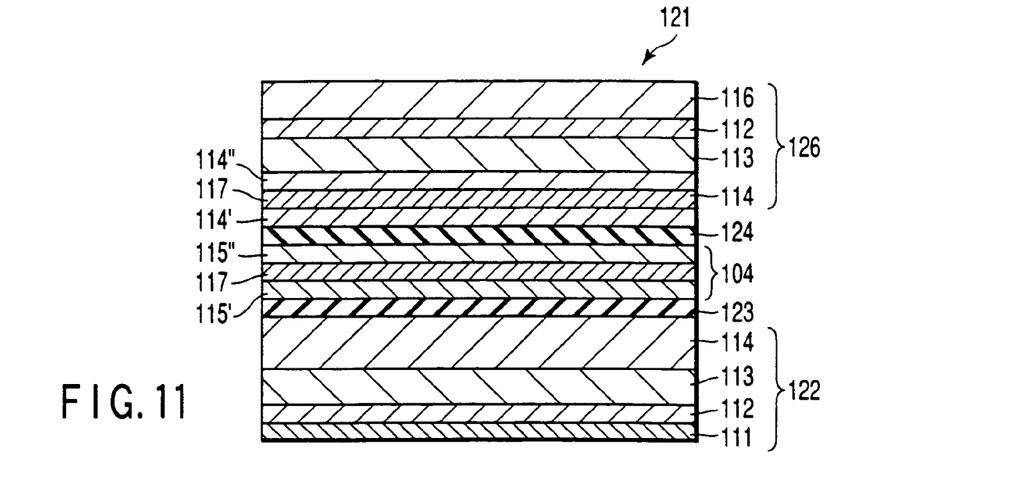

The double tunnel barrier layer structure and the spin valve structure can be used in combination. A MTJ element of the double tunnel barrier layer structure and the spin valve structure will be described below. FIGS. 9, 10 and 11 illustrate, in sectional form, examples of MTJ elements of the double tunnel barrier layer structure and the spin valve structure. The structures of the first fixed layer 122, the recording layer 104 and the second fixed layer 126 will be described in detail below.

The first fixed layer 122 of the MTJ element 121 shown in FIG. 9 has a template layer 111, an initial ferromagnetic layer 112, an antiferromagnetic layer 113, and a reference ferromagnetic layer 114, which are stacked in the order mentioned. The second fixed layer 126 has a reference ferromagnetic layer 114, an antiferromagnetic layer 113, an initial ferromagnetic layer 112, and a contact layer 116, which are stacked in the order mentioned.

The MTJ element 121 shown in FIG. 10 is structured such that the second fixed layer 126 has more layers than the one shown in FIG. 9. That is, though the first fixed layer 122 has the same structure as that in the MTJ element shown in FIG. 9, the second fixed layer 126 has a ferromagnetic layer 114', a nonmagnetic layer 117, a ferromagnetic layer 114'', an antiferromagnetic layer 113, an initial ferromagnetic layer 112, and a contact layer 116 which are stacked in the order mentioned.

The MTJ element 121 shown in FIG. 11 has a structure such that the recording layer 104 is composed of more layers than in FIG. 9 in addition to the structure of FIG. 10. That is, though the first fixed layer 122 and the second fixed layer 126 remain unchanged in structure from those in the MTJ element shown in FIG. 10, the recording layer 104 has a ferromagnetic layer 115', a nonmagnetic layer 117, and a ferromagnetic layer 115''. The structure of the MTJ element shown in FIG. 11 can suppress the generation of magnetic poles within the ferromagnetic materials in comparison with the one shown in FIG. 10, which is more suitable for miniaturizing of memory cells.

The structures of the MTJ element 121 shown in FIGS. 9, 10 and 11 are applicable to other embodiments which will be described later.

The method of manufacture of the magnetic memory device shown in FIGS. 4, 5A and 5B will be described below with reference to FIGS. 12A through 16B.

FIGS. 12A and 12B through FIGS. 16A and 16B are sectional views, in the order of steps of manufacture, of the magnetic memory device shown in FIGS. 4, 5A and 5B. FIGS. 12A, 13A, 14A, 15A and 16A correspond to sectional views taken along line VA—VA of FIG. 4. Likewise, FIGS. 12B, 13B, 14B, 15B and 16B correspond to sectional views taken along line VB—VB of FIG. 4.

Figure 12A:
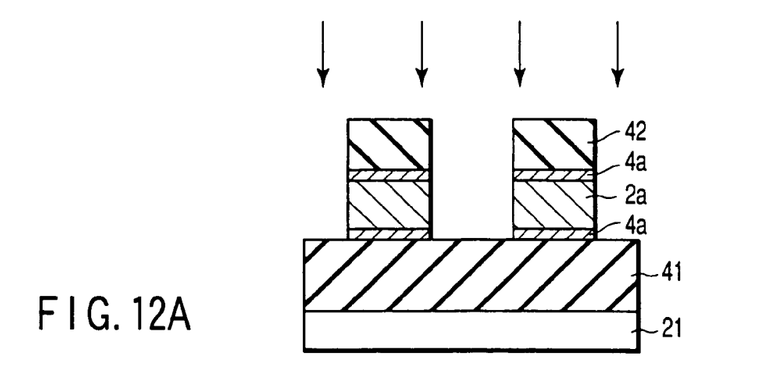
FIGS. 12A, 12B, 13A, 13B, 14A, 14B, 15A, 15B, 16A and 16B are sectional views, in the order of steps of manufacture, of the magnetic memory device shown in FIGS. 5A and 5B.
Figure 12B:
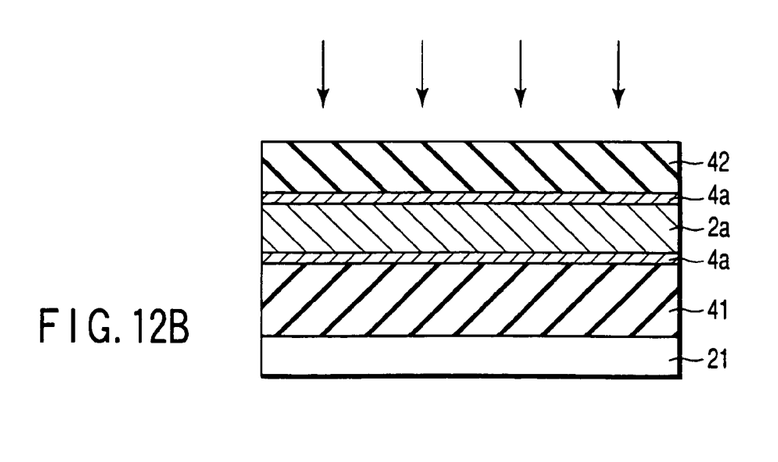

As shown in FIGS. 12A and 12B, an interlayer insulating film 41 is deposited on the surface of the semiconductor substrate 21 by means of, for example, CVD (Chemical Vapor Deposition). Next, a film 4a consisting of, for example, TiN/Ti, a film 2a consisting of, for example, Al or AlCu, and a film 4a consisting of, for example, TiN/Ti are deposited on the interlayer insulating film 41 in the order. Next, by using lithographic technique, a mask layer 42 is formed on the film 4a. The mask layer has remaining portions at a position in which the first write wiring 2 is to be formed. Each remaining portion corresponds in width to the first surface 23 of the first write wirings 2. Next, using the layer 42 as a mask, those portions of the films 4a and the film 2a are subjected to an etch step using RIE (Reactive Ion Etching) techniques.

Figure 13A:
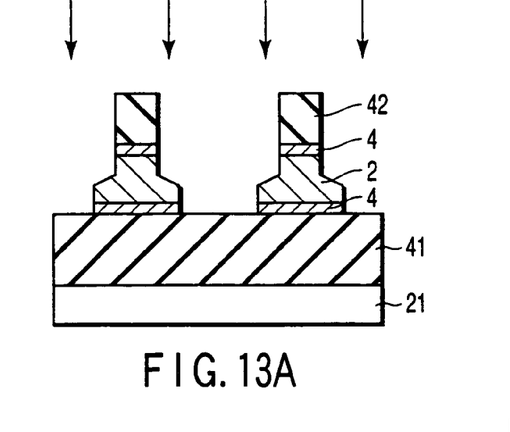
Figure 13B:
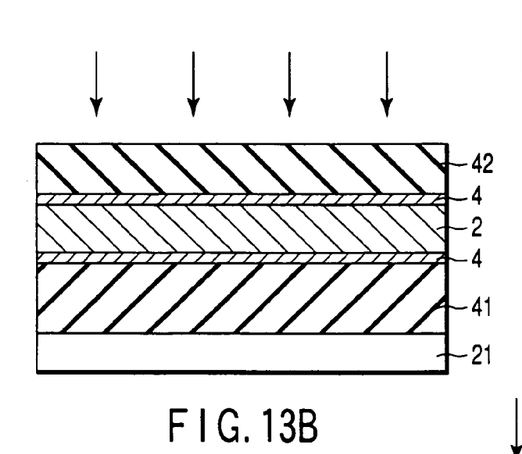

Next, as shown in FIGS. 13A and 13B, the remaining portions of the mask layer 42 are narrowed by means of CDE (Chemical Dry Etching) in an oxygen atmosphere by way of example until they corresponds in the width to the second surface 24 of the first write wiring 2. Subsequently, using the layer 42 as a mask, the film 4a and an upper part of the film 2a are subjected to an etch step by RIE, thereby forming the first write wirings 2 of substantially convex-shaped cross section.

Figure 14A:
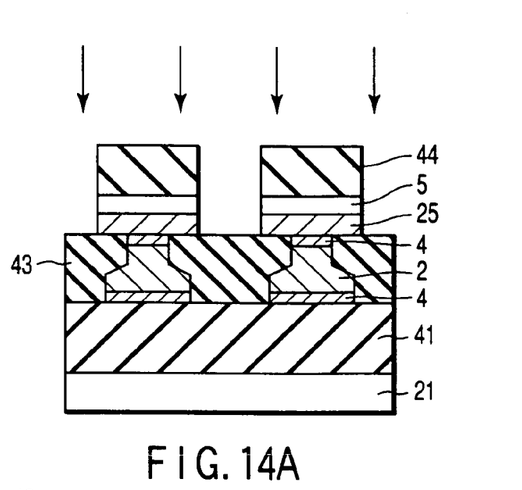
Figure 14B:
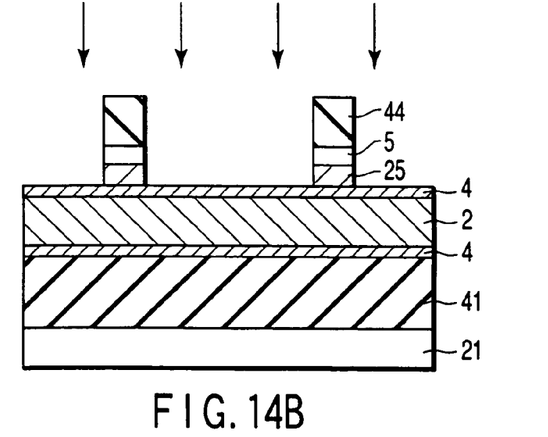

Next, as shown in FIGS. 14A and 14B, the space between the first write wirings 2 is filled with an interlayer insulating film 43. Subsequently, using the first wirings 2 as a stopper, the interlayer insulating film 43 is planarized. Next, by using CVD, lithographic and RIE techniques, contact plugs 25 and memory cells 5 are formed on the interlayer insulating film 43 and the top barrier metal 4. Reference numeral 44 denotes a mask layer.

Figure 15A:
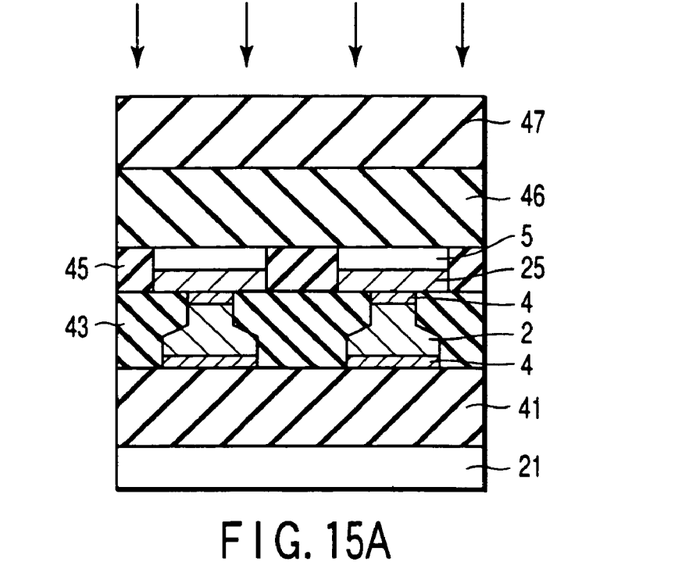
Figure 15B:
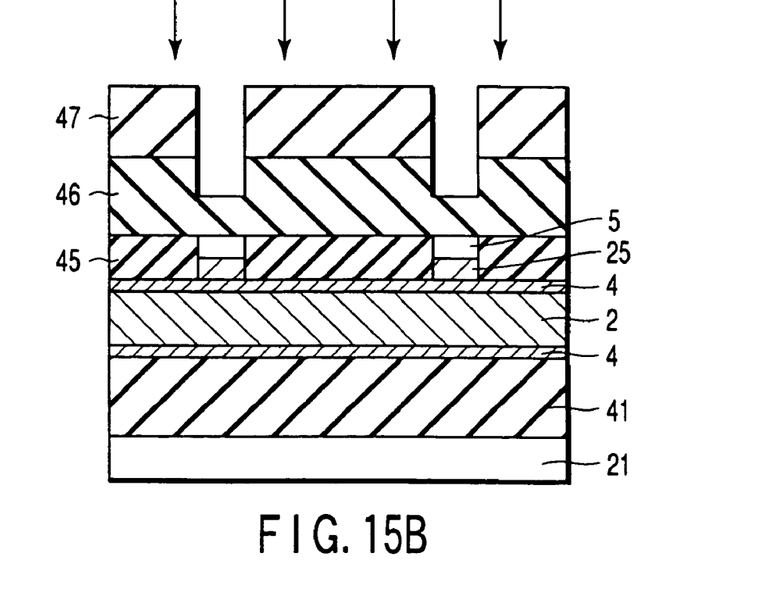

Next, as shown in FIGS. 15A and 15B, after the mask layer 44 has been removed, the space between each memory cell 5 is filled with an interlayer insulating film 45. Next, an interlayer insulating film 46 is deposited on the memory cells 5 and the interlayer insulating film 45. Subsequently, by using lithographic technique, a mask layer 47 is formed on the interlayer insulating film 46. The mask layer has openings above the memory cells 5. Each opening corresponds in width to the third surface 31 of the second write wirings 3. Next, using this layer 47 as a mask, an upper portion of the interlayer insulating film 46 is etched away.

Figure 16A:
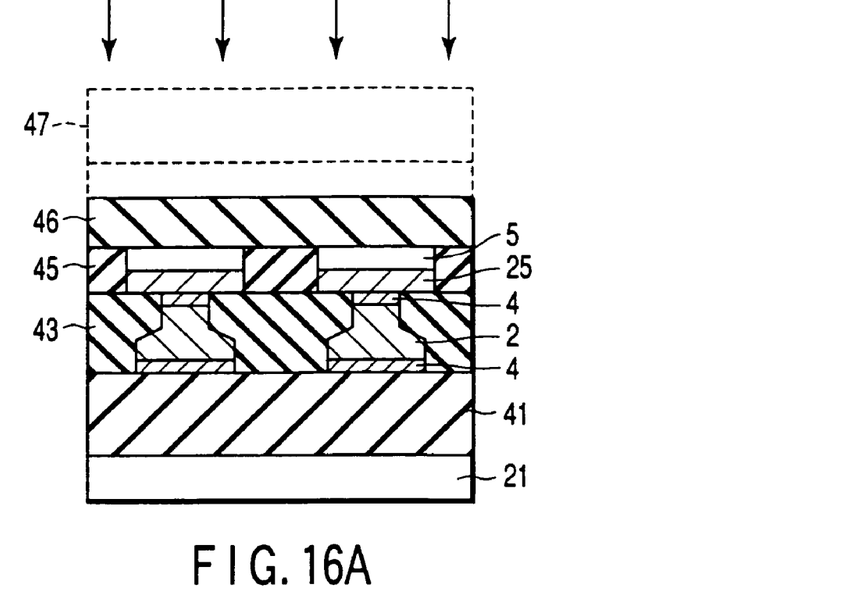
Figure 16B:
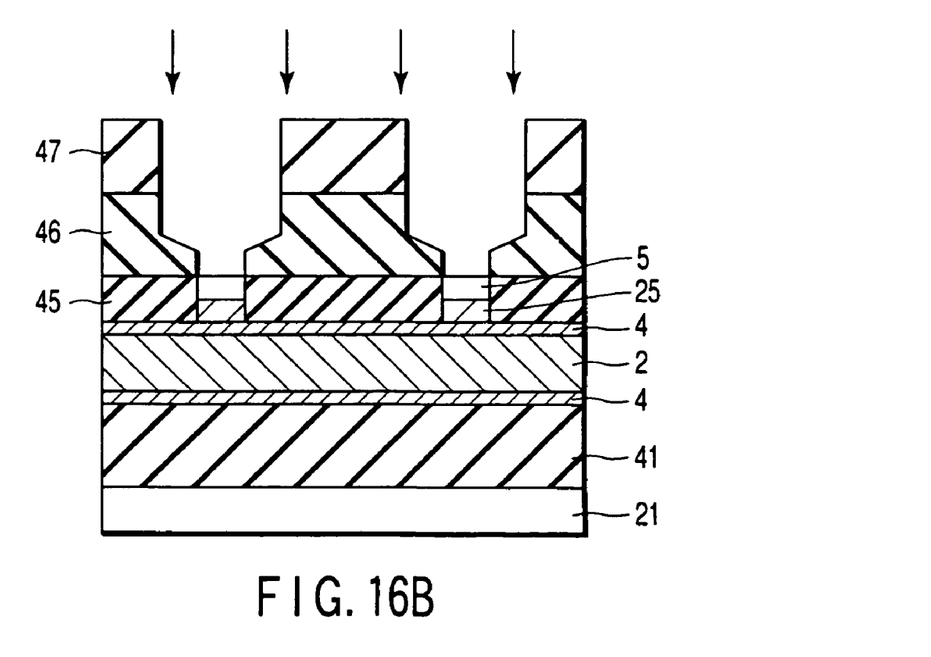

Next, as shown in FIGS. 16A and 16B, the resulting structure is subjected to a CDE step in an oxygen atmosphere by way of example to narrow the remaining portions of the mask layer 47. As a result, the openings of the mask layer 47 have a width corresponding to that of the fourth surface 32 of the second write wirings 3. Subsequently, portions of the interlayer insulating film 46 are etched by means of RIE. As a result, wiring trenches of upside down convex-shaped cross section are formed in the interlayer insulating film 46.

Next, as shown in FIGS. 5A and 5B, after the mask layer 47 have been removed, a barrier metal 4 and a material film for the second wirings 3 are formed in the wiring trenches. The surface of the resulting structure is planarized, whereby the barrier metal 4 and the second wirings 3 are formed.

Next, the reason why the width of the second surface 24 of the first write wirings 2 is set to two-thirds or less of that of the first surface 23 will be described with reference to FIGS. 4, 17 and 18. The same applies to the case of second write wirings 3 where the width of the third surface 31 is set to two-thirds or less of that of the fourth surface 32.

Figure 17:
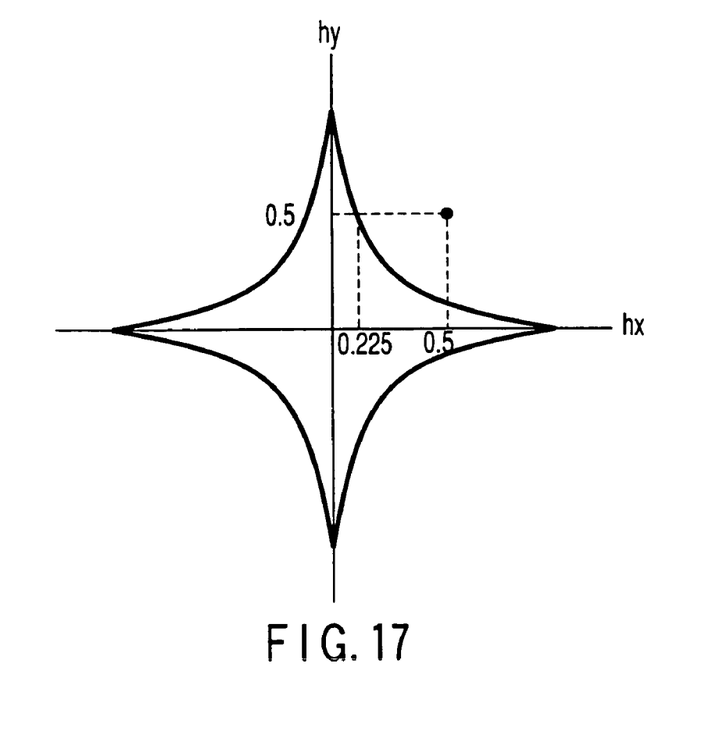
FIG. 17 illustrates an asteroid curve for use in explanation of a switching field.
Figure 18:
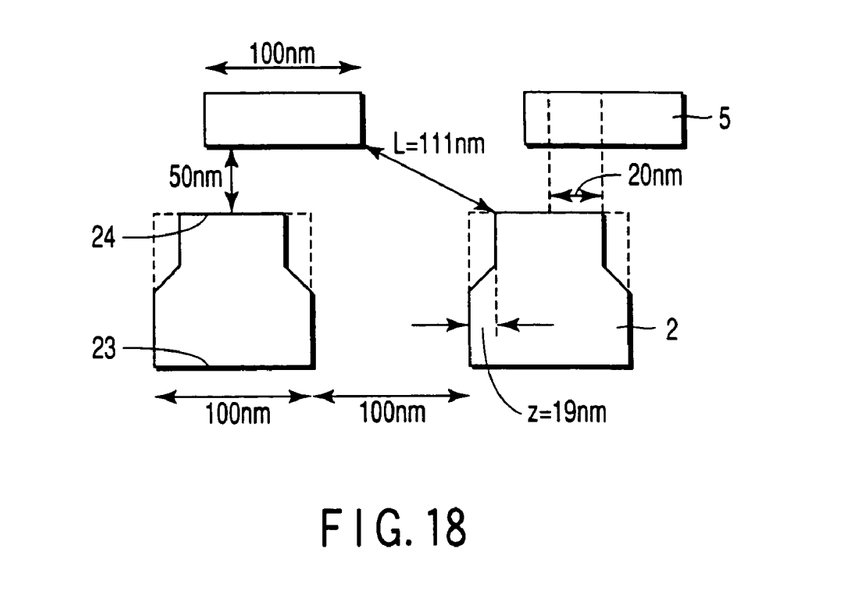
FIG. 18 is a diagram for use in explanation of the structure of the magnetic memory device of the first embodiment of the present invention.

First, consider the operating margin of the magnetic memory device for erroneous writing with reference to FIG. 17, which shows an ideal asteroid curve indicating the switching characteristics of a memory cell. This curve corresponds to the case where $hx^{2/3}+hy^{2/3}=1$, ($hx=Hx/Hy$, and $hy=Hy/Hx$, $Hk=a$ constant). When a composite magnetic field generated by the write wirings 2 and 3 comes outside the asteroid curve, information is written into a corresponding memory cell.

Suppose that a point such that $hx=hy=0.5$ (indicated by a black dot in the drawing) is used as a write operating point. Considering writing information into the selected memory cell 5a in FIG. 4, $hy=0.5$ will also be applied to the semi-selected memory cell 5b by the write wiring 2a. As can be seen from FIG. 17, therefore, if the leakage magnetic field applied to the memory cell 5b by the second write wiring 3a exceeds $0.225 \times Hk$, then information will be written into the memory cell 5b by mistake.

Considering the 0.1-$\mu$m generation of magnetic memory devices, it is supposed that write wiring width=100 nm, wiring spacing=100 nm, memory cell width=100 nm, and alignment tolerance <20 nm. The lower limit of the cell-to-wiring spacing in the vertical direction will be about 50 nm in view of defects of insulation films such as pinholes. FIG.

18 schematically illustrates these circumstances. In this figure, the write wirings 2 and the memory cells 5 are shown misaligned by 20 nm, the maximum of alignment tolerance.

The magnitude of leakage magnetic field is approximately in inverse proportion to the distance from a write wiring. Thus, the distance L between a write wiring and an adjacent cell is required to be larger than $$L = 50 \text{ (nm)} \times (0.5 \ Hk/0.225 \ Hk) = 111 \text{ (nm)}$$

In order to satisfy this requirement, it is required to reduce the width of the top surface of the write wirings by z (nm) on each side. Thus, solving $111^2 = (100-20+z)^2 + 50^2$ for z yields z=19 (nm). Therefore, the width of the second surface 24 should preferably be set to 0.1 $\mu$m−2×0.019 $\mu$m= 0.062 $\mu$m or less. That is, this value corresponds to approximately two-thirds or less of the width of the first surface 23. From considerations of the current density in the wirings 2 and the resistance of contact with the contact plug 25, it is desirable that the lower limit on the width of the second surface 24 be about one-third of the width of the first surface 23.

In the first embodiment of the present invention, each of the first write wirings 2 has its surface which faces corresponding one of the memory cells 5 made smaller in width than its opposite surface. Likewise, each of the second write wirings 3 has its surface which faces corresponding one of the memory cells 5 made smaller in width than its opposite surface. As a result, the distance between the write wirings 2 and 3 and the adjacent cells 5 can be made large without considerably reducing the cross-sectional area of the wirings 2 and 3. Thus, the possibility that semi-selected memory cells may be written with erroneous information by magnetic fields generated from the write wirings 2 and 3 can be decreased. It therefore becomes possible to increase a permissible level of current in the write wirings.

Furthermore, unlike the example of FIG. 3, it is possible to increase the distance between the first write wirings 2 and adjacent memory cells with the aspect ratio of those wirings kept unchanged from that in the prior art. Thus, in the process of filling the gap between each first write wiring 2 with the interlayer insulating film 43, the possibility of occurrence of gap filling failures can be reduced, preventing yield from becoming lowered due to the gap filling failures.

The magnetic memory device of the first embodiment is the so-called cross-point type in which the first write wirings 2 and the second write wirings 3 are electrically connected. With this type of magnetic memory device, care should be given to a potential difference between the write wirings produced when writing. That is, in writing information into a selected memory cell 5, a current of the order of several milliamperes is caused to flow in each of its associated first and second write wirings 2 and 3. Depending on the current value, a high voltage is produced between the first and second write wirings 2 and 3. Since, in the cross-point magnetic memory device, the first and second write wirings 2 and 3 are electrically connected as mentioned above, the high voltage may cause the tunnel barrier layer of the selected memory cell 5 to suffer dielectric breakdown. For this reason, a rectifying element can be connected in series with each memory cell 5 or some accommodation can be made in the circuit to prevent application of the high voltage to the selected memory cell 5.

Although, in FIGS. 4, 5A and 5B, the second write wirings 3 are placed over the first write wirings 2, they may be reversed.

[Second Embodiment]

Although the first embodiment of the present invention has been described in terms of a cross-point type magnetic memory device, the second embodiment is directed to a magnetic memory device of a type having select transistors.

Figure 19A:
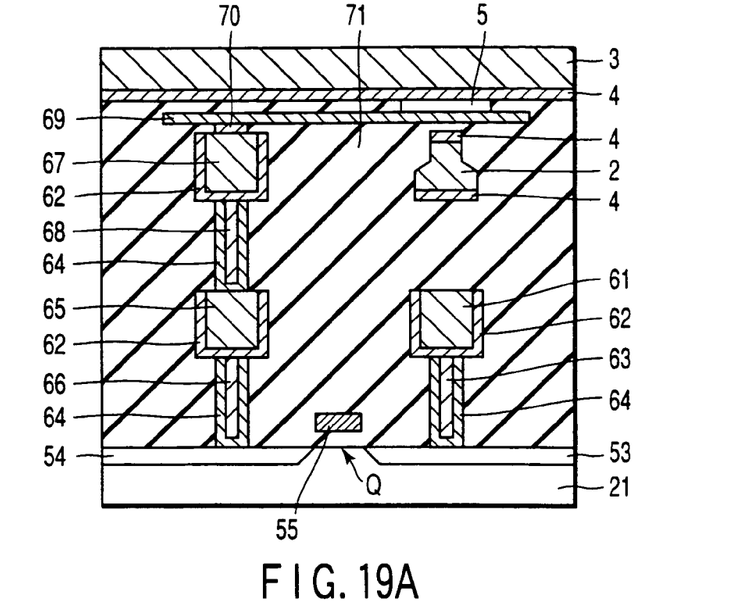
FIGS. 19A and 19B are schematic sectional views of a magnetic memory device according to a second embodiment of the present invention.
Figure 19B:
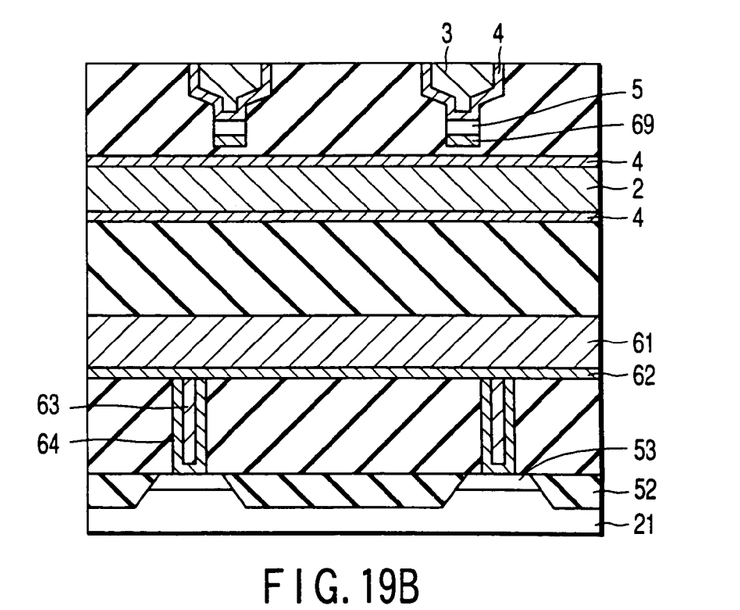

FIGS. 19A and 19B are schematic sectional views of a magnetic memory device according to the second embodiment of the present invention. The sectional views in FIGS. 19A and 19B are taken along lines perpendicular to each other.

As shown in FIGS. 19A and 19B, a device isolation insulating films 52 are formed in the surface of semiconductor substrate 21. A MIS (Metal Insulator Semiconductor) transistor Q is formed in an area between the device isolation insulating films 52. The transistor Q is composed of a source diffusion layer 53, a drain diffusion layer 54, a gate insulating film (not shown), and a gate electrode 55. The source diffusion layer 53 and the drain diffusion layer 54 are formed in the surface of the semiconductor substrate 21 with spacing therebetween. The gate electrode 55 is disposed on the gate insulating film located over a portion of the semiconductor substrate 51 between the source diffusion layer 53 and the drain diffusion layer 54.

A wiring layer 61 is provided over the source diffusion layer 53. The wiring layer 61 is, as desired, coated on bottom and side with a barrier metal 62 of damascene structure by way of example. Likewise, each wiring layer to be described later is formed with the barrier metal 62 as desired.

The wiring layer 61 and the source diffusion layer 53 are connected by a plug 63, which is formed around with the barrier metal 64 of the so-called damascene structure as desired. Likewise, each plug to be described later is coated with the barrier metal 64 as desired.

A wiring layer 65 is formed over the drain diffusion layer 54. The wiring layer 61 and the wiring layer 65 are located at substantially the same level. A plug 66 connects the wiring layer 65 and the drain diffusion layer 54. A wiring layer 67 is formed over the wiring layer 65. A plug 66 connects the wiring layer 65 and the wiring layer 67.

Over the wiring layer 61 is provided a first write wiring 2 of the same structure as that in the first embodiment. The first write wiring 2 is located at substantially the same level as the wiring layer 67.

Over the wiring layer 67 and the first write wiring 2 are provided a connecting wiring layer 69 in the form of nonmagnetic metal. The connecting wiring layer 69 extends from a point above the wiring layer 67 to a point above the first write wiring 2. The connecting wiring layer 69 is connected with the wiring layer 67 by a contact plug 70.

A memory cell 5 is placed in that position on the connecting wiring layer 69 which is over the first write wiring 2. A second write wiring 3 of the same structure as in the first embodiment is provided on the memory cell 5. Reference numeral 71 denotes an interlayer insulating film.

With the magnetic memory device having select transistors, information written into the memory cell 5 is read out through the connecting wiring layer 69 and the transistor Q.

The second embodiment provides the same advantages as the first embodiment.

[Third Embodiment]

Figure 20A:
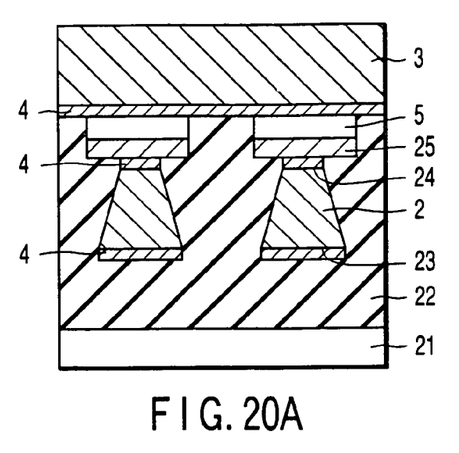
FIGS. 20A and 20B are schematic sectional views of a magnetic memory device according to a third embodiment of the present invention.
Figure 20B:
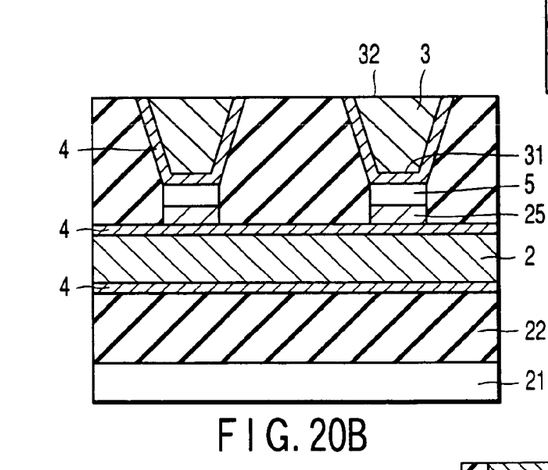

FIGS. 20A and 20B are schematic sectional views of a magnetic memory device according to a third embodiment of the present invention. The sectional views in FIGS. 20A and 20B are taken along lines perpendicular to each other.

As shown in FIGS. 20A and 20B, the width of the first write wiring 2 of the magnetic memory device of the third embodiment gradually decreases from the side of first surface 23 to the side of the second surface 24. The width of the second surface 24 is set to, say, two-thirds of that of the first surface 23.

Likewise, the width of the second write wiring 3 gradually decreases from the side of the fourth surface 32 to the side of the third surface 31. The width of the third surface 31 is set to, say, two-thirds of that of the fourth surface 32. In other respects, the third embodiment remains unchanged from the first embodiment.

Such write wirings 2 and 3 as shown in FIGS. 20A and 20B can be formed by the following steps:

For the first write wiring 2, in the process shown in FIG. 12 in the first embodiment, etching of the films 4a and 2a by RIE is performed in an atmosphere that contains a trace of oxygen. As a result, the remaining portion of the mask layer 42 is gradually narrowed, thus forming the first write wiring 2 of the shape shown in FIG. 20A.

For the second write wiring 3, in the process shown in FIG. 15, etching of the interlayer insulating film 46 by RIE is performed in an atmosphere that contains a trace of oxygen. As a result, the mask layer 47 is gradually narrowed, thus forming a trench for the second write wiring 3 of substantially V-shaped cross section shown in FIG. 20B. The other portions of the structure can be formed by the same processes as in the first embodiment.

The third embodiment can provide the same advantages as the first embodiment. In the third embodiment, the write wirings 2 and 3 are formed by adjusting the RIE conditions. Thereby, each of the write wirings 2 and 3 has the width of its surface facing the memory cell 5 made equal to about two-thirds of that of the opposite surface. For this reason, to implement a magnetic memory device having the same advantages as that of the first embodiment, the third embodiment requires fewer steps than the first embodiment.

[Fourth Embodiment]

A fourth embodiment of the present invention is directed to a magnetic memory device having magnetic circuits.

Figure 21A:
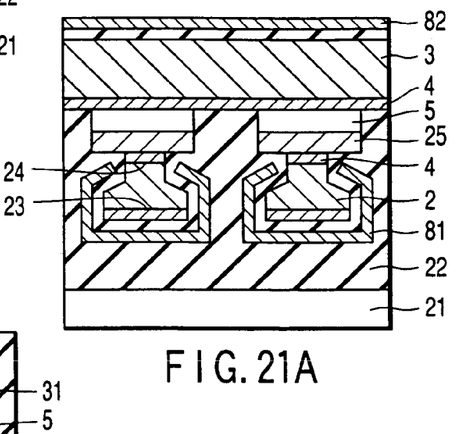
FIGS. 21A and 21B are schematic sectional views of a magnetic memory device according to a fourth embodiment of the present invention.
Figure 21B:
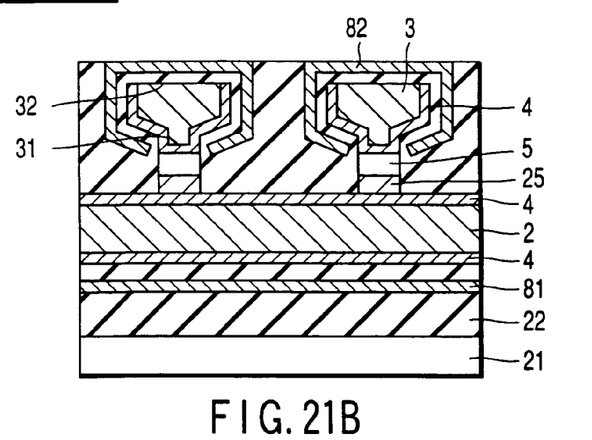

FIGS. 21A and 21B are schematic sectional views of a magnetic memory device according to the fourth embodiment of the present invention. The sectional views in FIGS. 21A and 21B are taken along lines perpendicular to each other.

As shown in FIGS. 21A and 21B, in addition to the structure of the first embodiment, magnetic circuits 81 and 82 are provided around the write wirings 2 and 3, respectively. More specifically, the magnetic circuit 81 is formed to face the side and the first surface 23 of the first write wiring 2. Also, the magnetic circuit 82 is formed to face the side and the fourth surface 32 of the second write wiring 3.

It is desirable that materials for the magnetic circuits 81 and 82 have magnetic response characteristics capable of following the width of write current pulses used in the magnetic memory device. For this reason, the materials should preferably satisfy the following conditions:

(1) the initial permeability is at least 100.
(2) the saturation magnetization is small.
(3) the specific resistance is high.

Thus, the magnetic circuits can be formed of a material of high permeability, such as permalloy, an Ni-based alloy, such as Mo-added permalloy, or an Fe-based alloy, such as sendust or FINEMET (a trademark). It is also possible to use an oxide ferromagnetic material such as ferrite or the like. Further, it is possible to add to these materials a metalloid, such as Si, B, or the like, or an additive agent, such as Cu, Cr, V, or the like, that allows grain boundary precipitates sludge to be produced readily. As a result, the alloys can be made a microcrystal aggregate, amorphous. It is preferable to optimize the shape of the magnetic circuits 81 and 82 so that domains are controlled suitably.

The fourth embodiment can provide the same advantages as the first embodiment. Further, the fourth embodiment is provided with the magnetic circuits 81 and 82 around the write wirings 2 and 3. For this reason, the magnetic flux produced around the write wirings 2 and 3 can be converged efficiently into the magnetic circuits 81 and 82. Thus, the magnetic field travels to the memory cells 5 effectively and the write current value can be reduced.

In the first through fourth embodiments, both of the first and second write wirings 2 and 3 are structured such that their surface facing the memory cell 5 has a width smaller than the opposite surface. However, it is also possible to cause only one of the first and second write wirings 2 and 3 to have such a structure.

Although the third and fourth embodiments have been described in terms of a cross-point type of magnetic memory device, they may be configured to include select transistors as used in the second embodiment. In addition, the third embodiment may be configured to include magnetic circuits as used in the fourth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a magnetoresistance element configured to store information;
   a first wiring provided along a first direction, the first wiring applying a magnetic field to the magnetoresistance element and having a first portion and a second portion, the second portion including a second surface which faces the magnetoresistance element, the first portion including a first surface opposite to the second surface, the second portion being smaller in width than the first portion; and
   a first magnetic circuit effectively applying a magnetic flux into the magnetoresistance element and surrounding the first wiring, a part of the first magnetic circuit around the second portion being smaller than a part of the first magnetic circuit around the first portion in width.

2. The device according to claim 1, wherein the second surface is two-thirds or less in width of the first surface.

3. The device according to claim 2, wherein the first wiring has a substantially T-shaped dross section.

4. The device according to claim 1, further comprising a second wiring provided along a second direction different from the first direction, the second wiring applying a magnetic field to the magnetoresistance element.

5. The device according to claim 4, wherein the second wiring has a third portion including a third surface which faces the magnetoresistance element and a fourth portion including a fourth surface opposite to the third surface, and the third portion is smaller in width than the fourth portion.

6. The device according to claim 5, further comprising a second magnetic circuit effectively applying a magnetic flux into the magnetoresistance element and surrounding the second wiring, a part of the second magnetic circuit around the third portion being smaller than a part of the second magnetic circuit around the fourth portion in width.

7. The device according to claim 5, wherein the third surface is two-thirds or less in width of the fourth surface.

8. The device according to claim 7, wherein the second wiring has a substantially T-shaped cross section.

9. The device according to claim 1, wherein the magnetoresistance element comprises:
 a first magnetic layer having a magnetization direction which is fixed,
 a nonmagnetic layer which faces the first magnetic layer, and
 a second magnetic layer which faces an opposite surface of the nonmagnetic layer from the first magnetic layer and stores information.

10. The device according to claim 9, wherein the nonmagnetic layer is an insulating layer.

11. The device according to claim 1, wherein the magnetoresistance element comprises:
 a first magnetic layer having a magnetization direction which is fixed,
 a first nonmagnetic layer which faces the first magnetic layer,
 a second magnetic layer which faces an opposite surface of the first nonmagnetic layer from the first magnetic layer and stores information,
 a second nonmagnetic layer which faces the second magnetic layer from the first nonmagnetic layer, and
 a third magnetic layer which faces the second nonmagnetic layer from the second magnetic layer.

12. The device according to claim 11, wherein a magnetization direction of the third magnetic layer is fixed.

13. The device according to claim 12, wherein each of the first and second nonmagnetic layers is an insulating layer.

14. The device according to claim 11, wherein the first nonmagnetic layers is an insulating layer.

15. The device according to claim 11, wherein the first wiring is electrically connected with the magnetoresistance element and has a function as a wiring to read information from the magnetoresistance element.

\* \* \* \* \*